US006452431B1

(12) United States Patent
Waldrop (10) Patent No.: US 6,452,431 B1
(45) Date of Patent: Sep. 17, 2002

(54) SCHEME FOR DELAY LOCKED LOOP RESET PROTECTION

(75) Inventor: William C. Waldrop, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 09/649,691

(22) Filed: Aug. 28, 2000

(51) Int. Cl.[7] ................................................ H03L 7/06

(52) U.S. Cl. ...................................... 327/158; 375/373

(58) Field of Search ................................ 327/141, 142, 327/147, 149, 150, 152, 153, 155, 156, 158, 159, 161, 162; 375/373, 375, 376

(56) References Cited

U.S. PATENT DOCUMENTS

| 5,875,219 | A | * | 2/1999 | Kim ............................ 327/144 |
| 6,125,157 | A | * | 9/2000 | Donnelly et al. ............ 375/371 |
| 6,269,051 | B1 | * | 7/2001 | Funaba et al. ................ 331/51 |
| 6,359,482 | B1 | * | 3/2002 | Miller ......................... 327/147 |

* cited by examiner

Primary Examiner—My-Trang Nu Ton
(74) Attorney, Agent, or Firm—Schwegman, Lundberg, Woessner & Kluth P.A.

(57) ABSTRACT

Systems and methods are provided for operating a delay locked loop during a reset. The systems and methods provide for activating a reset mode signal to prevent a phase lock signal from forcing the DLL out of a reset, and deactivating the reset mode signal only after at least one shifting operation is performed to allow the phase lock signal to correctly allow the DLL to be out of the reset.

28 Claims, 6 Drawing Sheets

SCHEME FOR DELAY LOCKED LOOP RESET PROTECTION

TECHNICAL FIELD OF THE INVENTION

The present invention relates generally to integrated circuits, and in particular to delay locked loop.

BACKGROUND OF THE INVENTION

Delay locked loops (DLL) are often used in integrated circuits (ICs) to generate an internal clock signal from an external clock signal. The internal clock signal usually as the same frequency or clock cycle as the external clock signal. However, the internal clock signal is used in place of the external clock signal to control certain operation within the IC because it is more manageable. It is also more accurate and matches the operating condition of the IC better than the external clock signal.

Since it is generated from the external clock signal, the internal clock signal is preferred to be synchronized with the external clock signal. To synchronize the two clock signals, a phase detector of the DLL compares a phase difference between them and applies an appropriate amount of delay until the internal clock signal is synchronized with the external clock signal. When the external and internal clock signals are synchronized, the DLL is locked.

In some instances, the DLL needs to be reset. For example, the DLL needs to be reset to start a new operation within the IC. In some of these instances, the reset can put the DLL in a false lock. A false lock occurs during the reset because the DLL might have compared the previously synchronized external and internal signals from before the reset, instead of comparing the external signal and the internal clock signal generated after the reset; because the internal clock signal generated after the reset may not arrive at the phase detector of the DLL on time for the comparison.

Thus, there is a need for a scheme to protect the DLL from a false lock during a reset.

SUMMARY OF THE INVENTION

The present invention includes a novel DLL having a false lock protection circuit. The false lock protection circuit prevents the DLL from performing a false lock during a reset of the DLL.

In one aspect, a method of operating a DLL is provided. The method includes activating a reset mode signal to prevent a phase lock signal from forcing the DLL out of a reset. The method also includes deactivating the reset mode signal only after at least one shifting operation is performed to allow the phase lock signal to correctly take the DLL out of the reset.

In another aspect, a delay locked loop (DLL) is provided. The DLL includes a delay line to receive an external signal to generate an internal signal. The DLL also includes a phase detector for comparing the external signal and a delayed version of the internal signal. The phase detector produces a phase lock signal when the external and internal signals are synchronized. The DLL further includes a false lock protection circuit for receiving the phase lock signal. The false lock protection circuit blocks the phase lock signal from forcing the DLL out of a reset when the external signal and an internal signal generated after receiving the reset signal are not synchronized.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Throughout the description of the invention, a node refers to a connection between two or more lines shown in the drawings. A node also refers to a line connected to a circuit element. In some instances, a node also refers to a line connected between two or more circuit elements or devices.

Figure 1:
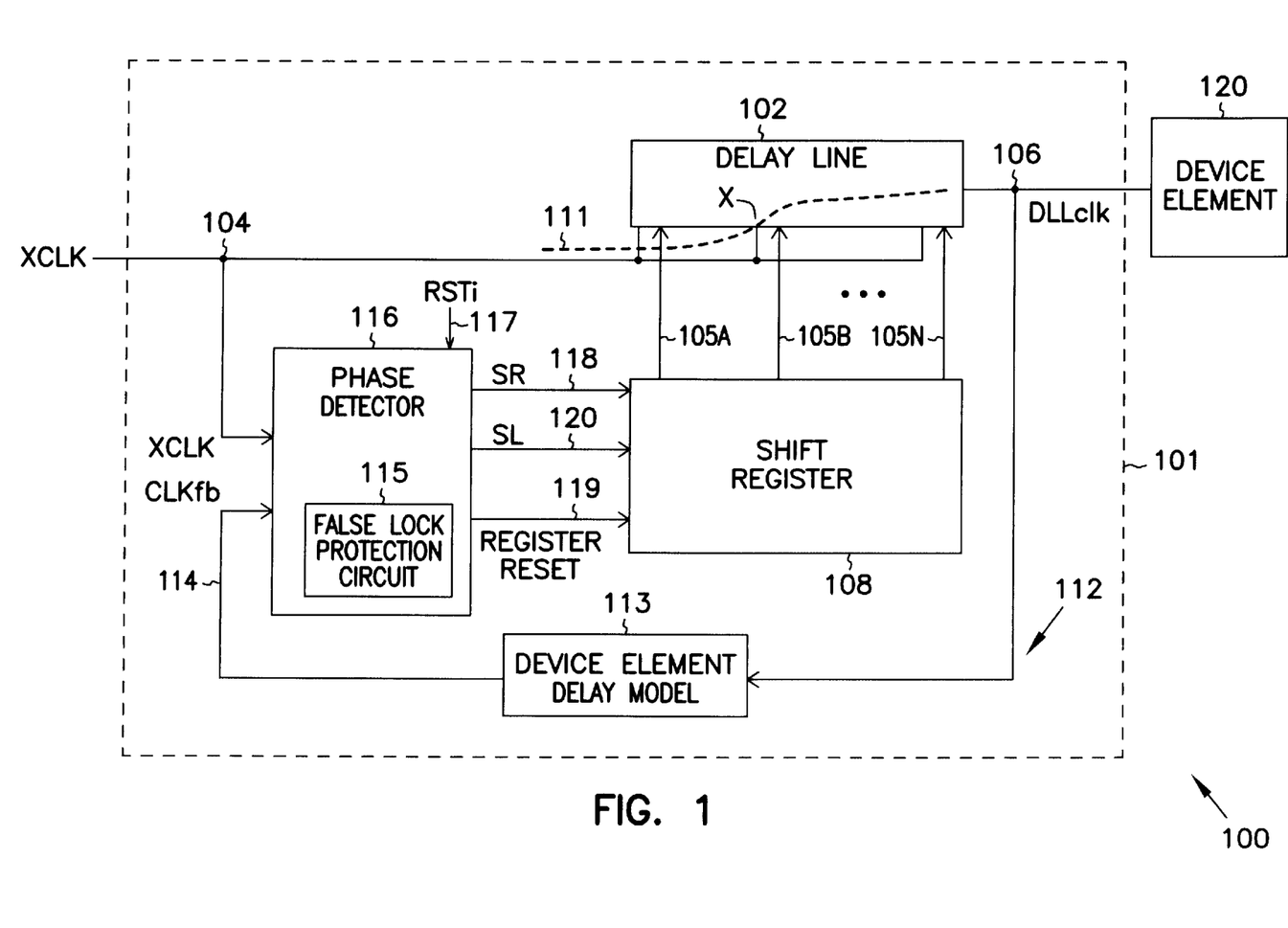
FIG. 1 is an integrated circuit having a DLL according to one embodiment of the invention.

FIG. 1 illustrates a block diagram of an integrated circuit 100 having a DLL 101 and a device element 120 according to one embodiment of the invention. In the Figure, DLL 101 includes a delay line 102 connected to receive an external input clock signal XCLK at node 104 and produce an internal clock signal (DLLclk) at node 106. Signal DLLclk is a delayed version of signal XCLK. A shift register 108 is connected to delay line 102 via a plurality of taps 105A–N. A feedback loop 112 having a device element delay model 113 is connected to receive DLLclk signal for producing a feedback signal CLKfb at node 114. A phase detector 116 is included in DLL 101. Phase detector 116 receives and compares XCLK and CLKfb signals to produce shifting signals. The shifting signals include a shift right (SR) and a shift left (SL) signal. A shift right signal SR is provided on node 118 connected to phase detector 116. A shift left signal SL is provided on node 120 to phase detector 116. And a register reset signal is provided on node 119. According to the teaching of the invention, phase detector 116 also includes a false lock protection circuit 115. False lock protection circuit 115 protects the DLL from performing a false lock when a reset signal RSTi is received at phase detector 116 on node 117.

Feedback loop 112 has a delayed time. This delayed time is the time required for a signal from node 106 to propagate to node 114. In FIG. 1, the delayed time of feedback loop 112 is set to be the same as a delayed time of device element 120. In another embodiment, the delayed time of feedback loop 112 can be tuned or programmed to match a delayed time of any circuit element connected to receive the DLLclk signal from node 106. Furthermore, feedback loop 112 can include an additional delay element (not shown) as would be necessary to match additional delay introduced by an input buffer circuit connected to receive XCLK signal before it entered node 104.

In operation, delay line 102 receives, at an entry point X, external clock signal XCLK from node 104 and generates internal signal DLLclk on node 106. Path 111 indicates a path in which XCLK signal enters the delay line 102 at point X and travels to node 106 and becomes DLLclk signal. Delay model 113 of feedback loop 112 receives DLLclk signal and produces a feed back signal CLKfb, which is fed back to phase detector 116 on node 114. Phase detector 116 compares the relative timing between the edges of XCLK and CLKfb signals and produces a SR signal on node 118 or a SL signal on node 120, which is transmitted to shift register 108. Shift register 108 receives the SR or the SL signal and performs a shift right or a shift left operation to select one of the taps 105A-N. As one of ordinary skill in the art will understand upon reading this disclosure, performing a shift right or shift left operation controls the amount of delay applied to the external clock signal by delay line 102. In other words, the shift right or shift left operation changes the entry at point X to the left or to the right such that appropriate amount of delay is applied to the external clock signal received at node 104.

When a shift right (SR) signal is received, shift register 108 selects one of the taps 105A-N to move point X to the right to decrease the amount of delay applied by delay line 102 to XCLK signal. Consequently, the amount of delay of CLKfb signal is decreased. When a shift left (SL) signal is received, shift register 108 selects one of the taps 105A-N to move point X to the left to increase the amount of delay in the XCLK signal. Consequently, the amount of delay applied to CLKfb is increased. One of ordinary skill in the art will readily recognize that shifting right and left are not absolute directions and are provided only for illustration purposes in connection with FIG. 1. When XCLK and CLKfb signals are substantially synchronized, in other words, when XCLK and CLKfb signals have the same phase, phase detector 116 disables shifting signals, SR and SL, to prevent shift register 108 from further shifting entry point X on delay line 102 to lock DLL 101.

Figure 2:
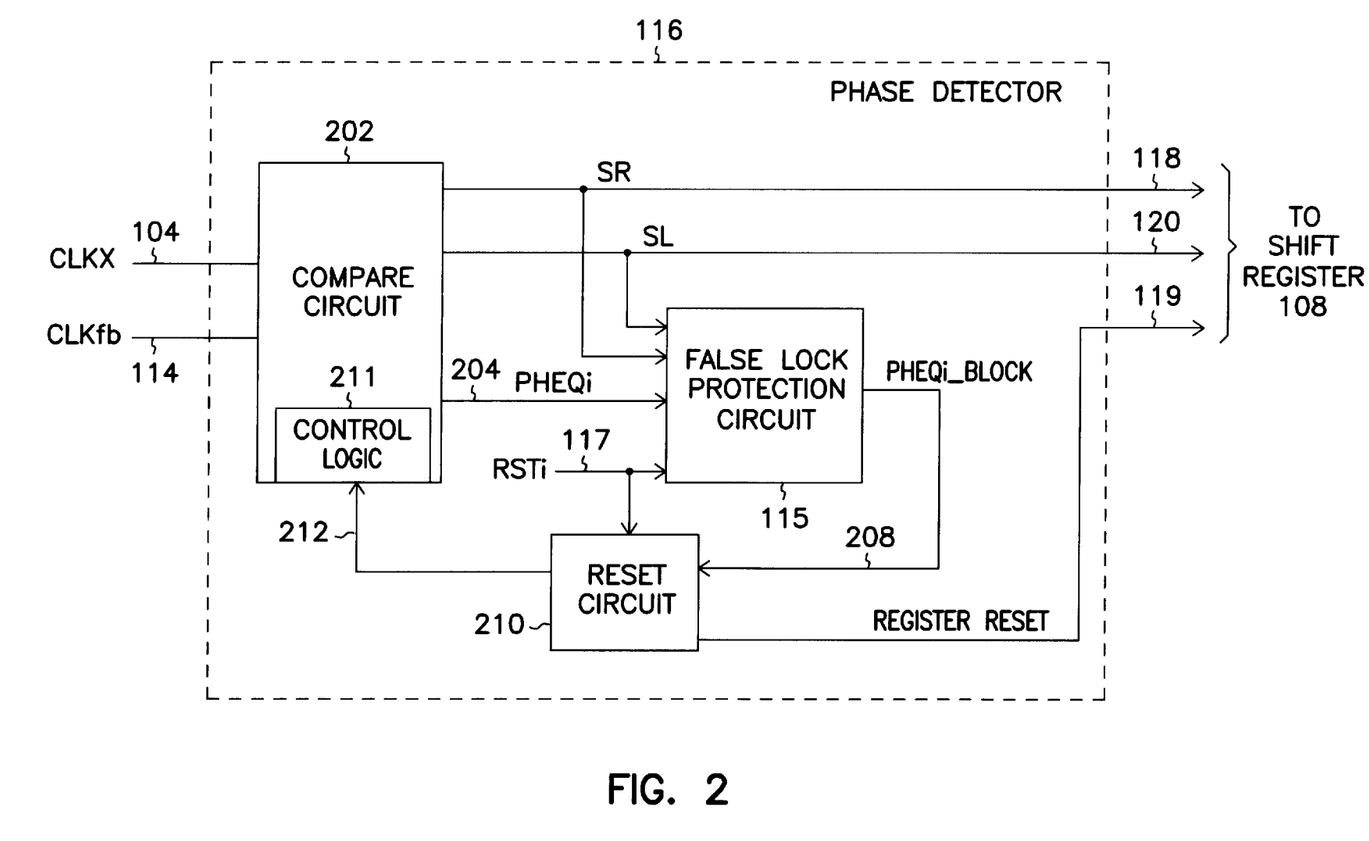
FIG. 2 is a block diagram of a phase detector of the DLL of FIG. 1.

FIG. 2 is a block diagram of phase detector 116 in DLL 101 of FIG. 1. Phase detector 116 includes a compare circuit 202 for receiving an XCLK signal at node 104 and a CLKfb signal at node 114. Compare circuit 202 includes a control logic 211, which sets a sampling rate of compare circuit 202 for comparing signals, XCLK and CLKfb, on nodes 104 and 114. Compare circuit 202 produces a SR signal on node 118, a SL signal on node 120, and a phase lock signal (PHEQi) on node 204. As shown in FIG. 2, phase detector 116 includes a false lock protection circuit 115. False lock protection circuit 115 is connected to receive the SR, the SL and the PHEQi signals and produce a block signal PHEQi_BLOCK on node 208. A reset circuit 210 is connected to compare circuit 202 at node 212. Reset circuit 210 is also connected to receive PHEQi_BLOCK from false lock protection circuit 115 at node 208. In addition, false protection circuit 115 and reset circuit 210 are connected to node 117 to receive reset signal RSTi.

In operation, compare circuit 202 samples XCLK and CLKfb signals and compares their phases. A SR signal is produced when XCLK signal is leading CLKfb signal. A SL signal is produced when XCLK is lagging CLKfb signal. The SR or SL signal is transmitted to shift register 108, which adjusts an amount of delay applied to XCLK signal in delay line 102. When XCLK and CLKfb signals are synchronized compare circuit 202 activates or produces phase lock signal PHEQi and disables shifting signals SR and SL in order to lock DLL 101. When DLL 101 is locked or when XCLK and CLKfb are synchronized, PHEQi_BLOCK signal enables the reset circuit 210 to cause control logic 211 to switch compare circuit 202 from a normal sampling rate to a slow sampling rate. In a normal sampling rate, compare circuit 202 samples XCLK and CLKfb at a certain rate to compare the two signals. In a slow sampling compare circuit 202 samples XCLK and CLKfb signals at a much slower rate than the normal rate. In some instances, the slower rate is about ten times slower than the normal rate. Sampling in a slower rate keeps DLLclk signal stable and prevents it from jittering.

In some instances, DLL 101 needs to be reset. In some of these instances, resetting the DLL can force the DLL to a false lock. A false lock occurs when DLL 101 is locked but the external clock signal and the internal clock signal generated after receiving the reset signal are not synchronized. False lock protection circuit 115 ensures that a false lock does not occur during a reset. This is achieved by disconnecting or blocking phase lock signal PHEQi from reset circuit 210 by PHEQi_BLOCK signal for a period of time. This period of time allows compare circuit 202 to sample the external clock signal and the internal clock signal generated after receiving the reset signal. The sampling causes shift register to perform at least one shifting operation. After the shifting operation and after the external clock signal and the internal clock signal generated are synchronized, PHEQi is then allowed to connect to reset circuit 210 so that DLL 101 is correctly taken out of the reset.

To illustrate a false lock better, it is assumed that false lock protection circuit 206 is taken out of phase detector 115 of FIG. 2. Thus, PHEQi signal at node 204 is provided directly to node 208 instead of the PHEQi_BLOCK signal. It is also assumed that XCLK signal has a 5 ns (nanosecond) clock cycle time. In some instances, feedback loop 112 has a delayed time which is greater than the external clock (XCLK) cycle time, i.e., 7 ns. This is where the problem arises. That is, when the feedback loop has a delayed time which is greater than the clock cycle time, compare circuit 202 starts sampling before the new internal clock signal DLLclk arrives as CLKfb signal at compare circuit 202. In such a case, the sampling of compare circuit 202 will erroneously detect the remnants of the prior synchronization and re-lock the DLL prematurely.

With all of the above assumptions, at the start of a reset, for example at time T0, reset signal RSTi is activated or enabled to reset DLL 101. In one embodiment, the reset signal RSTi includes a transition from a high signal level to a low signal level. When reset circuit 210 receives the RSTi signal, it sends an enable signal on node 212 to control logic 211. It also sends a register reset signal on node 119 to shift register 108, shown in FIG. 1. When control logic 211 receives the enable signal, it switches compare circuit 202 to the normal sampling rate. When shift register 108 receives the register reset signal, the shift register resets itself to a predetermined initial setting. Consequently, delay line 102 is also reset to the predetermined initial setting by the shift register. When delay line 102 is reset, signal DLLclk on node 106 changes to a new DLLclk signal. However, the new DLLclk signal will not appear at node 114 as new CLKfb signal until some time after 7 ns later (the delayed time of feedback loop, as assumed in the example). In the next clock cycle, 5 ns after T0, compare circuit 202 starts to compare signals on node 104 and 114. As assumed above, it takes 7 ns for the new DLLclk signal on node 106 to propagate through feedback loop 112 and arrives as CLKfb signal at node 114. At time T0+5 ns, nodes 104 and 114 still hold XCLK and CLKfb signals from before the reset. Thus, compare circuit 202 is comparing the XCLK and CLKfb signals from before the reset. At this time, the XCLK and CLKfb signals may still be synchronized, in which case, compare circuit 202 will prematurely produce a phase lock signal PHEQi. This forces the DLL to lock without even having activated a SR or SL signal to cause a shift operation. Although the DLL is locked again after receiving the reset signal, it is a false lock because XCLK signal and the new DLLclk signal arriving as CLKfb at time T0+7 ns, are not synchronized. Therefore, the phase lock signal at this time is a false phase lock signal.

Once the DLL 101 is locked, reset circuit 210 causes control logic 211 to switch compare circuit 202 to the slow sampling rate. Thus, the false phase lock signal has forced compare circuit 202 to switch the DLL to the slow sampling rate prematurely. In doing so, the false lock signal has added inefficiency to DLL 101. In other words, now the DLL has switched to a slow sampling rate, it will take longer to achieve a true lock in a subsequent DLL operation. To illustrate this point, using the same assumptions above, at time T0+7 ns, the new DLLclk (after 7 ns second delayed) appears at node 114 as new CLKfb signal. However, it is not until compare circuit 202 samples XCLK and the new CLKfb signals at (T0+10 ns), the beginning of the third clock cycle that the compare circuit 202 samples the correct XCLK and CLKfb signals. At this time, compare circuit 202 is sampling in the slow sampling rate. The slow sampling rate causes the DLL to unnecessarily waste cycle times to achieve a true lock. The slow sampling rate can also cause the DLL to exceed a predetermined lock time allowance. These factors consequently reduce the performance of the device where the DLL resides. In summary, without false lock protection circuit 115, DLL 101 can have a false lock during a reset if the clock cycle time of external clock signal XCLK is smaller than the delayed time of feedback loop 112.

Figure 3:
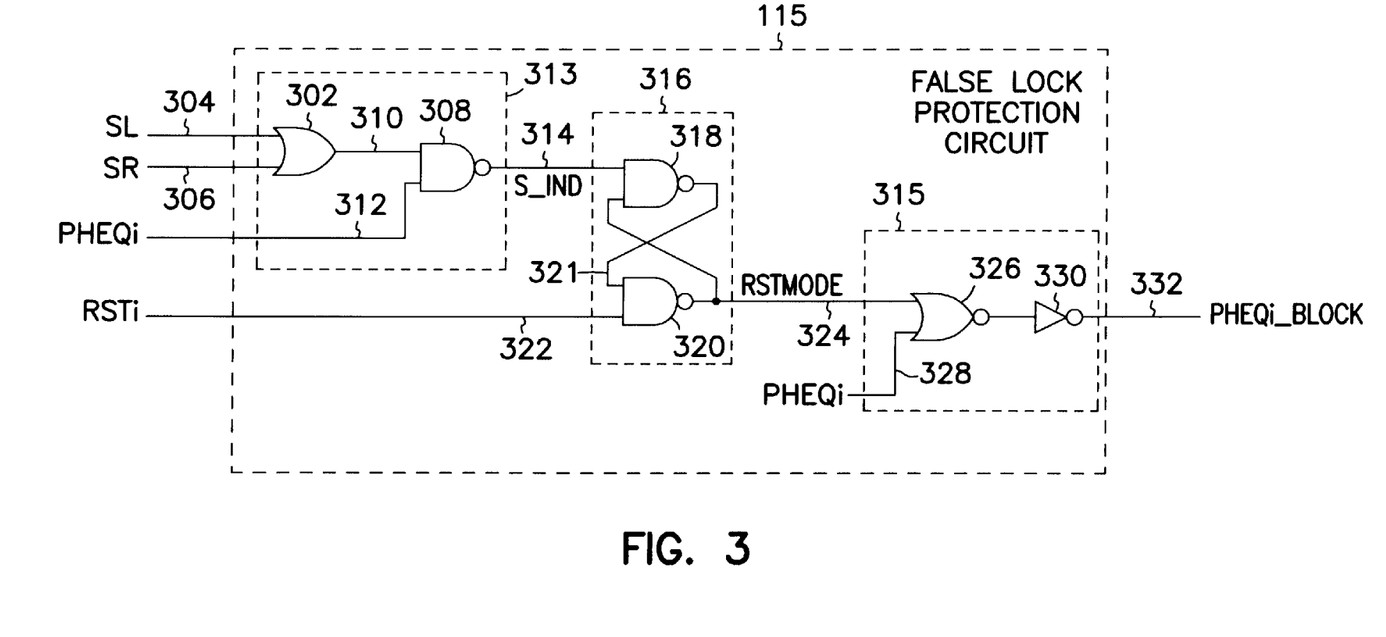
FIG. 3 is a schematic diagram of a false lock protection circuit of the phase detector of FIG. 2.

FIG. 3 is a schematic diagram of one embodiment of false lock protection circuit 115 shown in FIGS. 1 and 2. False lock protection circuit 115 includes a flip-flop 316 having a first input node 314, a second input node 322 and an output node 324. An input logic 313 is connected to the flip-flop 316 at node 314. And an output logic 315 is connected to flip-flop 316 at node 324. Input logic 313 includes input nodes 304, 306 and 312, and an output connected to node 314. Node 314 provides a shift indicating signal S_IND to input 314 of flip-flop 316. Input logic 313 also includes an OR gate 302 and a NAND gate 308. Input nodes 304 and 306 are connected to inputs of OR gate 302. Nodes 304 and 306 receive signals SL and SR, respectively. The output of OR gate 302 provides one input to NAND gate 308 at node 310. NAND gate 308 has another input connected to receive phase lock signal PHEQi at node 312 as produced by compare circuit 202 when XCLK and CLKfb signals are synchronized. NAND gate 308 also includes an output which is connected as a first input to flip-flop 316 at node 314. As explained above, the signal on node 314 is a shift indicating signal (S_IND).

Flip-flop 316 includes cross-coupled NAND gates 318 and 320. The second input node 322 of flip-flop 316 receives a reset signal RSTi. The output of NAND gate 318 is connected to an input of NAND gate 320 at node 321. The second input node 322 provides another input to NAND gate 320. The first input node 314 of flip-flop 316, e.g., S_IND signal, provides an input to NAND gate 318. The output of NAND gate 320 provides the input to NAND gate 318. Output of NAND gate 320 also provides a mode signal RSTMODE.

Output logic 315 includes a NOR gate 326. NOR gate 326 includes one input node 328 for receiving phase lock signal PHEQi. Node 324 serves as the other input node for NOR gate 326. Thus, it receives signal RSTMODE from flip-flop 316 at node 324. Output logic 315 includes an output node 332 for providing block signal PHEQi_BLOCK. For one embodiment the output of NOR gate 326 is connected to an invertor 330, which provides PHEQi_BLOCK to node 332.

Figure 4:
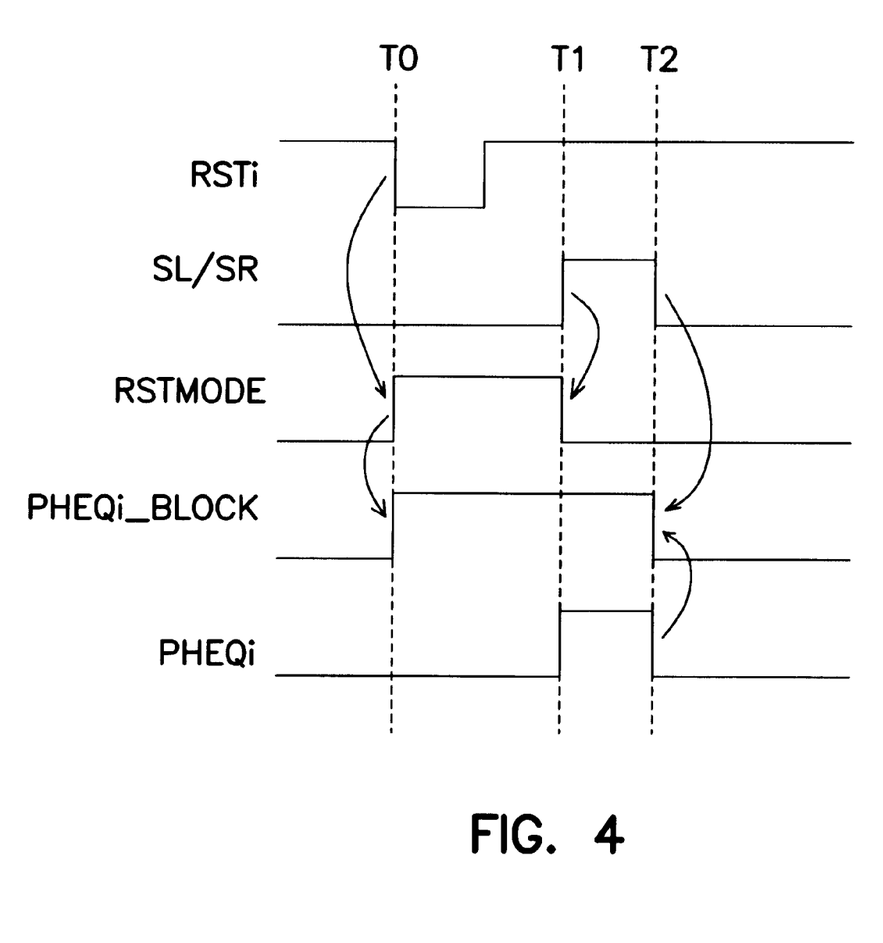
FIG. 4 is a timing diagram illustrating the operation of the false lock protection circuit of FIG. 3.

The operation of false lock protection circuit 115 as described in the embodiment of FIG. 3 is described with reference to a timing diagram of FIG. 4. An arrow in FIG. 4 shows how a first signal affects a state of a second signal when the first signal changes state. To illustrate how false lock protection circuit 115 protects DLL 101 from the false lock described previously, the previous assumptions for timing are kept the same. That is XCLK signal has a 5 ns clock cycle time, feedback loop 112 has a delayed time of 7 ns, and DLL 101 is presently locked. That means the external and internal clock signals are synchronized. FIG. 4 illustrates a timing diagram of false protection circuit 115 shown in FIGS. 3. In FIG. 4, before signal RSTi transitioning to a low signal level (LOW) to indicate a reset (before time T0), signals SL, SR and PHEQi are initially LOW because DLL 101 is currently locked. When SL, SR and PHEQi signals are LOW, signal S_IND at node 314 is forced to a high signal level (HIGH). When S_IND is HIGH, it allows node 321 HIGH, because node 324 is initially LOW. Thus, before RSTi signal is received at node 322 (before T0), node 321 remains HIGH, and node 322 remains HIGH. This makes RSTMODE signal on node 324 LOW, which forces PHEQi_BLOCK signal LOW.

At time T0, the RSTi signal at node 322 transitions LOW, indicating a reset is applied to DLL 101. In FIG. 3, a LOW RSTi signal forces a HIGH to RSTMODE signal. When RSTMODE signal is HIGH, it forces a HIGH to node 332, which means that signal PHEQi_BLOCK is activated or enabled. When PHEQi_BLOCK is enabled, the DLL is prevented from a lock. As long as RSTMODE signal is HIGH (between T0 ant T1), a change in phase lock signal PHEQi at node 328 has no effect on node 332. In other words, whenever RSTMODE is HIGH, PHEQi_BLOCK is also HIGH and remains in this state until a valid or true phase lock signal occurs after receiving the reset signal. Phase lock signal PHEQi is assumed to be true only after at least one shifting operation is performed. According to the present invention, the novel false lock protection circuit ensures that a shift operation after receiving the reset signal indicates that XCLK and the new DLLclk signals have been detected and compared. Thus even if PHEQi signal is LOW any time between T0 and T1, it is prevented from putting DLL to a lock because SR or SL signal remains LOW keeping RSTMODE signal HIGH during this time indicating no shift has been performed. In other words, PHEQi signal is blocked from locking the DLL for an amount of time equal to at least the delayed time of the feedback loop. This gives new DLLclk signal time to propagate to compare circuit 202 after the reset signal is received so that the DLL can achieve a true lock.

At time T1, SL or SR transitions HIGH to indicate a phase different between XCLK and CLKfb signals has been detected and compared. At this time, PHEQi signal and the output of OR gate 302 are asserted HIGH indicating the DLL is not locked (unlocked). At this point, RSTi signal at node 322 has transitioned HIGH. Since one of the signals SL or SR is HIGH at node 304 or 306, indicating that at least one shift operation is performed, node 310 is forced HIGH, which makes signal S_IND on node 314 LOW. When S_IND signal is LOW on node 314, it causes the output of NAND gate 318 on node 321 HIGH. Now, both nodes 321 and 322 are HIGH, therefore, RSTMODE signal at the output of NAND gate 320 on node 324 is LOW. Since there is at least one shift operation is performed after time T1, a next PHEQi signal transitioning LOW after time T1 at node 328 will force a LOW to PHEQi_BLOCK signal at node 332. When PHEQI_BLOCK is LOW, it indicates that phase lock signal PHEQi is valid or true.

At time T2, shift register 108 has performed at least one shift. Due to the novel false lock protection circuit of the present invention, the external and internal clock signals are synchronized. Thus, compare circuit 202 forces PHEQi and SR or SL signals LOW. And due to the present invention, this time, PHEQi signal is a true phase lock signal. The LOW PHEQi signal causes PHEQi_BLOCK signal to change its state from HIGH to LOW, which subsequently allows reset circuit 210 to lock the DLL and take the DLL quickly and efficiently out of reset mode. Thus, due to the present invention, the DLL will not be taken out of reset mode before the correct DLL lock occurs. In other words the DLL will not be taken out of reset mode before it has correctly synchronized the external and internal clock signals. Only after PHEQi_BLOCK signal goes LOW is the reset circuit 210 allowed to make the control logic 211 to switch compare circuit 202 to a slow sampling rate. Thus the inefficiency has been avoided because the DLL is locked at an appropriate time with a correct synchronization between the external and internal clock signals.

In summary, at time T0, reset signal RSTi transitions LOW causing RSTMODE signal HIGH, which makes PHEQi_BLOCK HIGH to block phase lock signal PHEQi from locking the DLL and taking it out of reset mode. At time T1, SL or SR transitions HIGH, indicating at least one shift operation is performed, after receiving reset signal RSTi, reset mode signal RSTMODE is deactivated LOW. After time T1, when RSTMODE is deactivated, a next transition of phase lock signal PHEQi will be valid. At time T2, PHEQi transitions LOW indicating XCLK and the new DLLclk signals are synchronized. This causes PHEQi_BLOCK to change state from HIGH to LOW to allow PHEQi signal to put the DLL to a true lock.

Referring to false lock protection circuit 115 of FIG. 3, one of ordinary skill in the art will understand upon reading the disclosure of this invention that other circuit elements can be substituted to produce PHEQi_BLOCK signal operation as described above. The invention is not so limited. In one example, OR gate 302 can be omitted from input logic 313 and either signal SL or SR is connected directly to node 310. In another example, an OR gate can be used to substitute NOR gate 326 and inverter 330 output logic 315.

Figure 5:
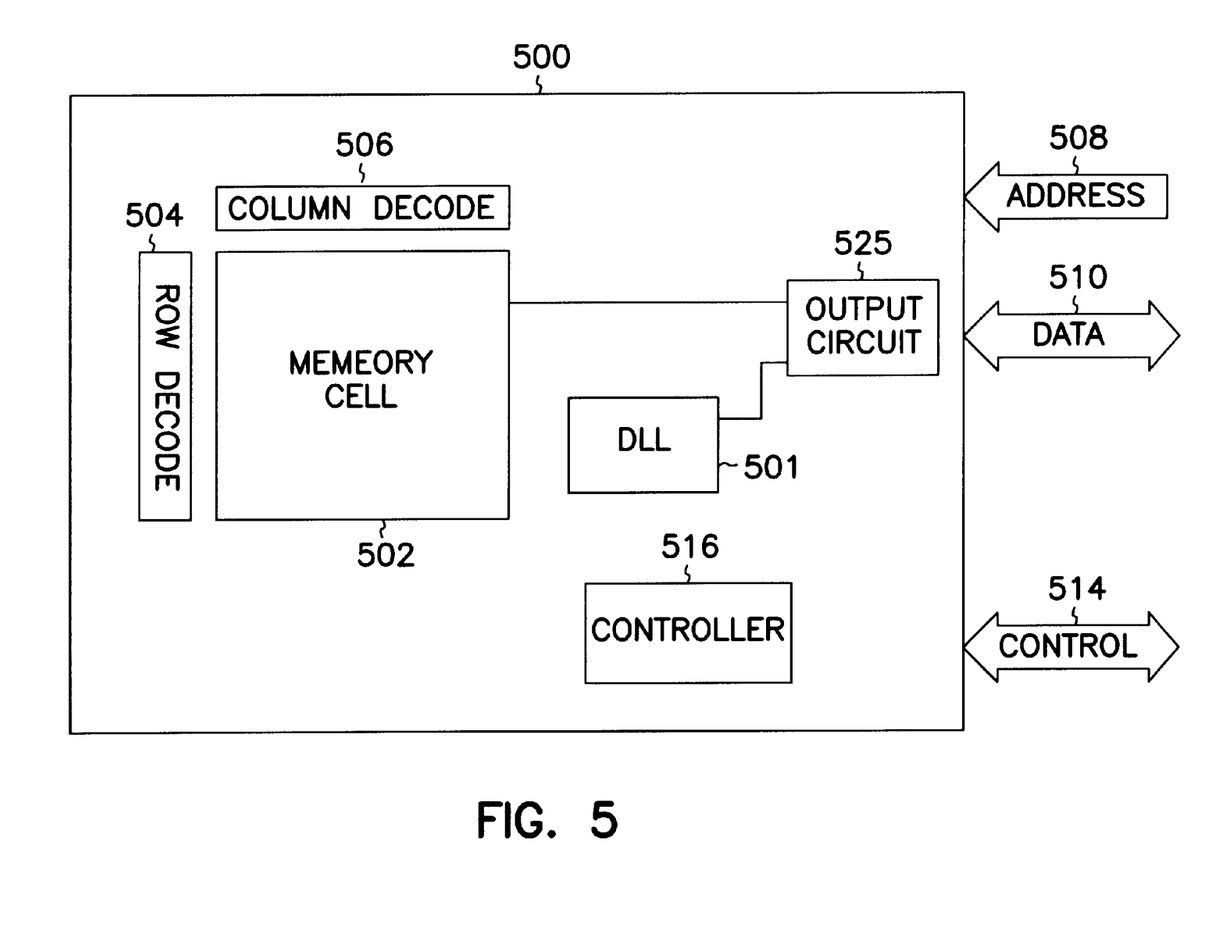
FIG. 5 is a block diagram of a memory device having the DLL according to another embodiment of the invention.

FIG. 5 is a block diagram of a memory device 500 having the DLL of the invention. Memory device 500 includes a plurality of memory cells 502 generally arranged in rows and columns. Row decode circuit 504 and column decode circuit 506 access the rows and columns in response to an address, provided on a plurality of address lines 508. Data is transferred to and from memory device 500 through input/output lines or data lines 510. A memory controller 516 controls data communication to and from memory device 500 in response to command signals on control lines 514. According to the teaching of the present invention, memory device 500 includes a DLL 501. DLL 501 includes DLL 101 embodiment of FIG. 1. Thus, DLL 501 has a circuit which includes false lock protection circuit 115 as described in detail above in connection with FIGS. 1–4. DLL 501 is used to control at least one timing function of memory device 500. For example, DLL 501 can be connected to an output circuit 525. Output circuit 525 represents a device element which is shown in FIG. 1 as device element 120. Output circuit 525 receives an output signal from the DLL, such as DLLclk signal shown in FIG. 1, to latch an output data signal outputted from memory cells 502 to data lines 510.

Memory device 500 of FIG. 5 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs. Those of ordinary skill in the art will readily recognize that memory device 500 of FIG. 5 is simplified to illustrate one embodiment of a memory device of the present invention and is not intended to be a detailed description of all of the features of a memory device.

Figure 6:
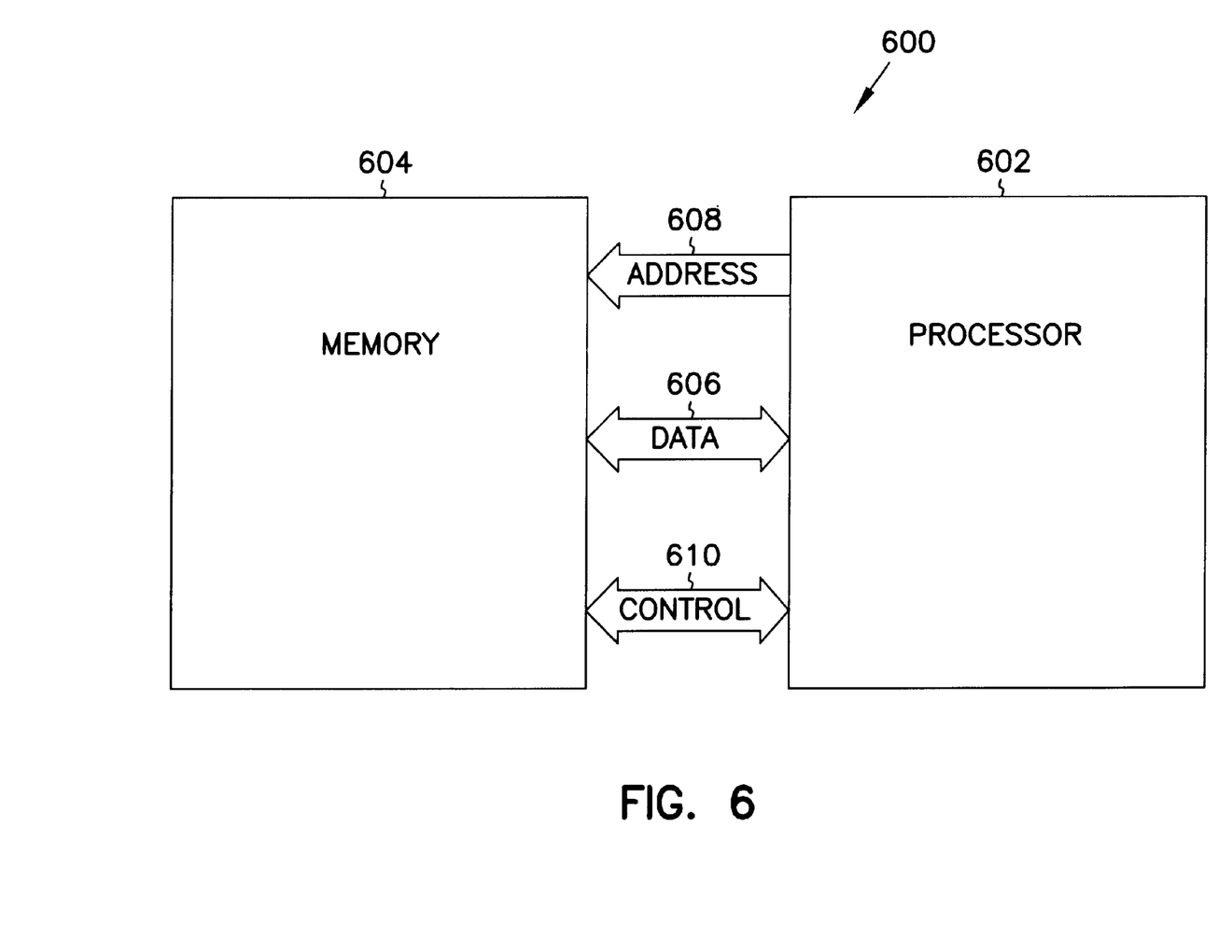
FIG. 6 is a block diagram of a system according to another embodiment of the invention.

FIG. 6 shows a system 600 according to the invention. System 600 includes processor 602, and memory 604. System 600 can also include many other devices such as memory controllers, input/output devices, and others. These other devices are omitted from FIG. 6 for ease of illustration. Processor 602 can be a microprocessor, digital signal processor, embedded processor, microcontroller, or the like. According to the teaching of the present invention, memory 604 includes memory device 500, which includes a DLL such as DLL 101 of the invention shown in FIG. 1. Processor 602 and memory 604 communicate using address signals on lines 608, control signals on lines 610, and data signals on lines 606. In some embodiments, a clock signal generated by a DLL located internally in memory 604, such as DLLclk signal, is used to drive control inputs of circuit elements that drive outputs of memory 604. For example, data signals on lines 606 can be driven by circuit elements such as device element 120 of FIG. 1. The DLL internal to memory 604 provides a mechanism for improved and efficient communications between processor 602 and memory 604.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of resetting a delay locked loop (DLL) while the DLL is locked, the method comprising:
   receiving a reset signal to start a reset;
   activating a block signal to disable a phase lock signal from forcing the DLL out of the reset when an external clock signal and an internal signal generated after receiving the reset signal are not synchronized;
   activating a shift indicating signal to indicate a shifting operation has performed after receiving the reset signal to synchronize the external signal and the internal signal generated after receiving the reset signal; and
   enabling the phase lock signal to allow the DLL to be out of the reset when the external and internal signals are synchronized.

2. The method of claim 1, wherein activating a block signal includes subsequently holding the block signal in one signal level until the external and internal signals are synchronized.

3. The method of claim 1, wherein activating a shift indicating signal includes changing a shift signal from one signal level before receiving the reset signal to another signal level after receiving the reset signal, wherein the shift signal causes the shifting operation.

4. A method of operating a delay locked loop (DLL), the method comprising:

receiving an external signal to generate an internal signal at an internal node;

activating a phase lock signal when the external and internal signals are synchronized;

receiving a reset signal to start a reset, wherein after receiving the reset signal, a new internal signal is generated at the internal node;

activating a mode signal to prevent the phase lock signal from forcing the DLL out of the reset when the external signal and the internal signal generated after receiving the reset signal are not synchronized; and deactivating the mode signal to allow the DLL to be out of the reset when the external signal and the internal signal generated after receiving the reset signal are synchronized.

5. The method of claim 4, wherein activating the mode signal includes disabling the phase lock signal from switching the DLL from a sampling rate to a slower sampling rate when the external signal and the internal signal generated after receiving the reset signal are not synchronized.

6. The method of claim 4, wherein activating a mode signal includes preventing the phase lock signal from changing a block signal to another signal level.

7. The method of claim 4, wherein deactivating the mode signal includes performing at least one shifting operation after receiving the reset signal to synchronize the external signal and the internal signal generated after the receiving the reset signal.

8. A method of resetting a delay locked loop (DLL), the method comprising:

disabling a phase lock signal when a reset signal is received at the start of a reset of the DLL, the phase lock signal indicating an external signal and an internal signal are synchronized;

performing at least one shifting operation after receiving the reset signal to synchronize the external signal and and the internal signal generated after receiving the reset signal; and enabling the phase lock signal to take the DLL out of the reset only after at least one shifting operation is performed.

9. The method of claim 8, wherein disabling a phase lock signal includes activating a mode signal to disconnect the phase lock signal from a reset circuit when the external signal and the internal signal generated after receiving the reset signal are not synchronized.

10. The method of claim 8, wherein performing at least one shifting operation includes comparing the external signal and the internal signal generated after receiving the reset signal.

11. The method of claim 8, wherein enabling the phase lock signal includes disabling the mode signal to connect the phase lock signal to the reset circuit to take the DLL out of the reset.

12. A method of operating a delay locked loop (DLL), the method comprising:

generating an internal signal from an external signal;

enabling the DLL to lock with a phase lock signal when the external and internal signals are synchronized;

receiving a reset signal;

activating a block signal to prevent the phase lock signal to lock the DLL after receiving the reset signal; and deactivating the block signal to allow the phase lock signal to lock the DLL after receiving the reset signal and after at least one shifting function is performed to synchronize the external and the internal signal generated after receiving the reset signal.

13. The method of claim 12, wherein generating the internal signal includes delaying the external signal by a delay line.

14. The method of claim 12, wherein enabling the DLL to lock including comparing the external and internal clock until they are synchronized.

15. The method of claim 12, wherein activating a block signal includes receiving a mode signal, wherein the block signal changes its signal level only after the mode signal changes its signal at least once.

16. A method of operating a delay locked loop (DLL), the method comprising:

generating an internal signal from and external signal;

comparing the external and internal signals;

producing shifting signals to perform shifting function to synchronize the external and internal signals;

disabling shifting signals to lock the DLL a first time when the external and internal signals are synchronized;

receiving reset signal;

activating a block signal to prevent the DLL to lock a second time after receiving the reset signal when the external signal and the internal signal generated after receiving the reset signal are not synchronized;

performing at least one shifting function to synchronize the external signal and the internal signal generated after receiving the reset signal; and disabling the block signal to allow the DLL to lock when the external signal and the internal signal generated after receiving the reset signal are synchronized.

17. The method of claim 16, wherein generating the internal signal includes delaying the external signal by a delay line.

18. The method of claim 16, wherein activating a block signal includes receiving a mode signal, wherein the block signal changes its signal level only after the mode signal changes its signal at least once.

19. A method of operating a delay locked loop (DLL), the method comprising:

activating a reset mode signal to disable a phase lock signal from forcing the DLL out of a reset; and deactivating the reset mode signal only after at least one shifting operation is performed to enable the phase lock signal to take the DLL out of the reset.

20. A delay locked loop (DLL) comprising:

a delay line to receive an external signal to generate an internal signal;

a phase detector connected to compare the external signal and a delayed version of the internal signal and to produce a phase lock signal when the external and internal signals are synchronized; and a protection circuit within the phase detector connected to receive the phase lock signal, wherein the protection circuit blocks the phase lock signal from forcing the DLL out of a reset when the external signal and the internal signal generated after receiving the reset signal are not synchronized.

21. The delay locked loop of claim 20 further comprising a shift register to control the delay line to apply appropriate amount of delay to the external signal.

22. The delay locked loop of claim 21 further comprising a feedback loop to generate the delayed version of the internal signal.

23. A delay locked loop (DLL) comprising:
an internal node to receive a reset signal during a reset;
a delay line for receiving an external signal to generate an internal signal;
a shift register for controlling the delay line to apply an amount of delay to the external signal;
a feedback loop connected to receive the internal signal to produce a feedback signal; and
a phase detector for comparing the external signal and the feedback signal, the phase detector including a false lock protection circuit, the false lock protection circuit allowing the shift register to perform at least one shifting operation to synchronize the external and internal signals after the reset signal is received.

24. The delay locked loop of claim 23, wherein the input signal has a cycle time, wherein the feedback loop has delayed time, wherein delayed time is greater than the cycle time during the reset mode.

25. A delay locked loop (DLL) comprising:
an input node to receive an external signal;
a delay circuit for receiving the external signal to generate an internal signal;
a feedback loop for receiving the internal signal to generate a feedback signal;
a shift register connected to the delay circuit to perform a shifting operation to synchronize the external signal and the feedback signal; and
a false lock protection circuit comprising connected to the feedback loop and the shift register, the false lock protection circuit:
an input logic for producing a shift indicating signal;
a flip-flop for receiving the shift indicating signal and a reset signal at a reset to produce a mode signal; and
an output logic for receiving the mode signal to produce a block signal, wherein the signal level of the block signal changes to another signal level only after the shift indicating signal changes state to indicate the shift register has performed at least one shifting operation after the flip-flop receives the reset signal.

26. A memory comprising:
memory cells; and
a delay locked loop (DLL) connected to the memory cells, the DLL having
a delay line to receive an external signal to generate an internal signal;
a phase detector connected to compare the external signal a delayed version of the internal signal to produce a phase lock signal when the external and internal signals are synchronized; and
protection circuit within the phase detector connected to receive the phase lock signal, wherein the protection circuit blocks the phase lock signal from forcing the DLL out of a reset when the external signal and the internal signal generated after receiving the reset signal are not synchronized.

27. A memory device comprising:
memory cells;
an output circuit connected to the memory cells;
a delayed locked loop (DLL) connected to the output circuit and the memory cells, the DLL comprising:
an internal node to receive a reset signal during a reset;
a delay line for receiving an external signal to generate an internal signal;
a shift register for controlling the delay line to apply an amount of delay to the-external signal;
a feedback loop connected to receive the internal signal to produce a feedback signal; and
a phase detector for comparing the external signal and the feedback signal, the phase detector including a false lock protection circuit, the false lock protection circuit forcing the shift register to perform at least one shifting operation to synchronize the external and internal signals after the reset signal is received.

28. A system comprising:
a processor; and
a memory device connected to the processor, the memory device comprising a delay locked loop (DLL), the DLL comprising:
a delay line to receive an external signal to generate an internal signal;
a phase detector connected to compare the external signal and a delayed version of the internal signal to produce a phase lock signal when the external and internal signals are synchronized; and
a protection circuit within the phase detector connected to receive the phase lock signal, wherein the protection circuit blocks the phase lock signal from forcing the DLL out of a reset when the external signal and the internal signal generated after receiving the reset signal are not synchronized.

* * * * *

UNITED STATES PATENT AND TRADEMARK OFFICE
CERTIFICATE OF CORRECTION

PATENT NO. : 6,452,431 B1 Page 1 of 1
DATED : September 17, 2002
INVENTOR(S) : William C. Waldrop It is certified that error appears in the above-identified patent and that said Letters Patent is hereby corrected as shown below:

Column 1,
Line 11, delete "as" and insert -- has --, therefor.

Column 6,
Line 37, delete "ant" and insert -- and --, therefor.

Column 7,
Line 6, delete "PHEQI" and insert -- PHEQi --, therefor.

Column 10,
Line 21, delete "and" and insert -- an --, therefor.

Column 11,
Line 36, delete "comprising" after "circuit".
Line 38, insert -- comprising -- after "circuit".

Column 12,
Line 7, insert -- a -- before "protection".
Line 24, delete "-" after "the".

Signed and Sealed this

Fourth Day of February, 2003

JAMES E. ROGAN
*Director of the United States Patent and Trademark Office*